(12) United States Patent
Huang et al.

(10) Patent No.: US 6,384,353 B1
(45) Date of Patent: May 7, 2002

(54) MICRO-ELECTROMECHANICAL SYSTEM DEVICE

(75) Inventors: Jenn-Hwa Huang, Gilbert; Samuel L. Coffman, Scottsdale; Xi-Qing Sun, Chandler; Ji-Hai Xu, Gilbert; John Michael Parsey, Jr., Phoenix, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/495,786

(22) Filed: Feb. 1, 2000

(51) Int. Cl.[7] .............................................. H01H 57/00
(52) U.S. Cl. ........................................ 200/181; 335/78
(58) Field of Search ................................ 200/181, 572; 335/78; 257/414, 411, 421, 531, 600

(56) References Cited

U.S. PATENT DOCUMENTS

| | | | | |
|---|---|---|---|---|
| 4,959,515 A | * | 9/1990 | Zavracky et al. ............ | 200/181 |
| 5,258,591 A | * | 11/1993 | Buck .......................... | 200/181 |
| 5,278,368 A | * | 1/1994 | Kasano et al. .............. | 200/181 |
| 5,367,136 A | * | 11/1994 | Buck .......................... | 200/600 |
| 5,475,280 A | * | 12/1995 | Jones et al. ................. | 331/309 |
| 5,511,428 A | | 4/1996 | Goldberg et al. | |
| 5,610,431 A | | 3/1997 | Martin | |
| 5,638,946 A | * | 6/1997 | Zavracky .................... | 200/181 |
| 5,668,033 A | | 9/1997 | Ohara et al. | |
| 5,872,496 A | * | 2/1999 | Asada et al. ................... | 335/78 |
| 6,046,659 A | * | 4/2000 | Loo et al. ..................... | 333/262 |
| 6,057,520 A | * | 5/2000 | Goodwin-Johansson .... | 200/181 |
| 6,100,477 A | * | 8/2000 | Randall et al. ............. | 200/181 |
| 6,143,997 A | * | 11/2000 | Feng et al. .................. | 200/181 |
| 6,153,839 A | * | 11/2000 | Zavracky et al. ........... | 200/181 |

FOREIGN PATENT DOCUMENTS

| | | |
|---|---|---|
| EP | 0 637 871 A1 | 2/1995 |
| EP | 0 851 492 A3 | 12/1998 |
| FR | 2 780 200 A1 | 6/1998 |

OTHER PUBLICATIONS

PCT International Search Report; Int'l. Application No. PCT/US 01/03210, 5 pgs. (no date).

* cited by examiner

*Primary Examiner*—Renee Luebke
*Assistant Examiner*—Nhung Nguyen

(57) ABSTRACT

A Micro-Electromechanical Systems (MEMS) device (100) having conductively filled vias (141). A MEMS component (124) is formed on a substrate (110). The substrate has conductively filled vias (140) extending therethrough. The MEMS component (124) is electrically coupled to the conductively filled vias (140). The MEMS component (124) is covered by a protective cap (150). An electrical interconnect (130) is formed on a bottom surface of the substrate (110) for transmission of electrical signals to the MEMS component (124), rather than using wirebonds.

20 Claims, 2 Drawing Sheets

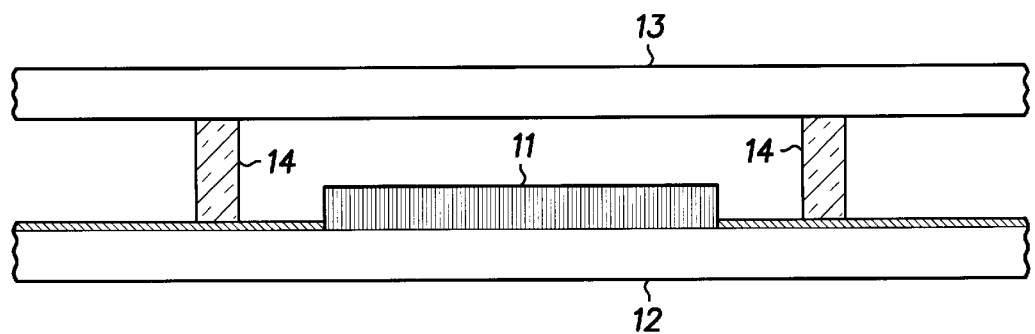
- PRIOR ART - FIG. 1
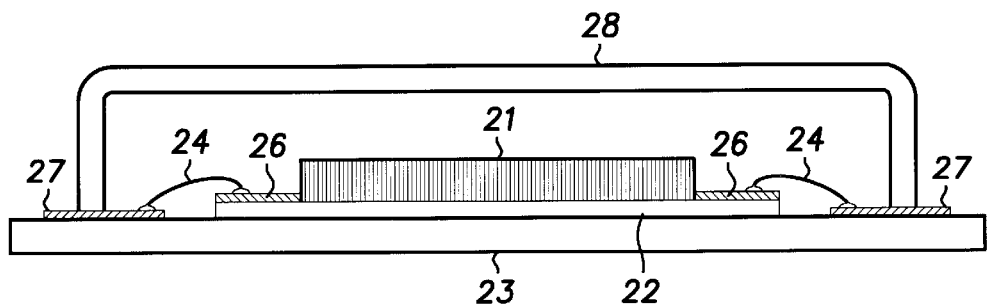
- PRIOR ART - FIG. 2
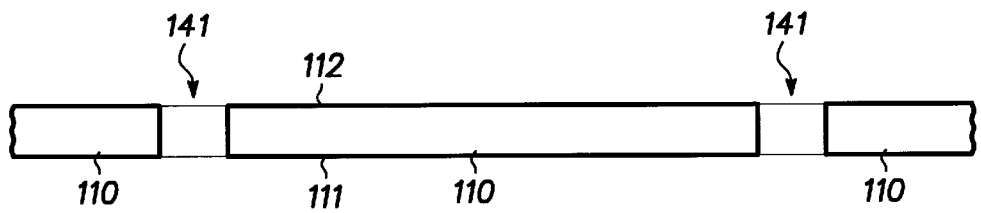
FIG. 3
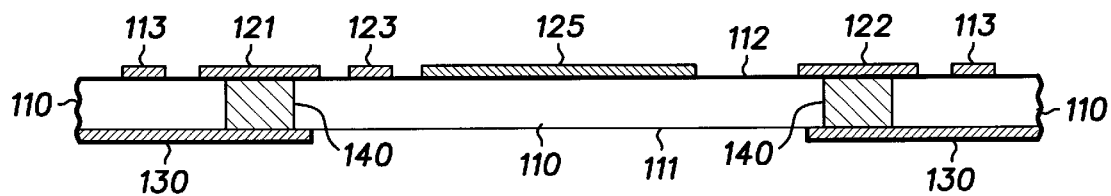
FIG. 4

MICRO-ELECTROMECHANICAL SYSTEM DEVICE

CROSS-REFERENCE TO RELATED APPLICATIONS

This application is related to the U.S. patent application entitled "MICRO-ELECTROMECHANICAL SWITCH," filed concurrently with the present application, and which has at least one common co-inventor and is assigned to the same assignee as the present application. The related application is incorporated by reference into the present application.

FIELD OF THE INVENTION

The present invention relates, in general, to Micro-Electromechanical System (MEMS) devices and, more particularly, to manufacturing MEMS devices.

BACKGROUND OF THE INVENTION

FIG. 1 illustrates a MEMS device 10 manufactured in accordance with a prior art technique referred to as a glass paste wafer capping technique. In this technique, a plurality of MEMS devices 11 (one shown) are manufactured on a device wafer 12 such as a silicon wafer. Independently, a screen print of glass paste is deposited on a second wafer 13, which is commonly referred to as a cap wafer. The glass paste is cured to form spacers 14, which are then aligned and bonded to device wafer 12. The two wafer combination is then diced by sawing into individual devices. A critical limitation of this technique is that the temperature needed to bond the glass spacers to the device wafer ranges from approximately 400 to 500 degrees Celsius (° C.). Temperatures this high can easily damage the MEMS device. Another limitation of this technique is that it is relatively complicated due to the use of screen printing and wafer bonding procedures. Complicated processes are typically less cost efficient because of the added complexity and the lower yield of operational devices.

FIG. 2 illustrates a MEMS device 20 manufactured in accordance with a prior art technique referred to as a cap/cavity technique. In this technique, a plurality of MEMS devices 21 (one shown) are fabricated on a device substrate 22, which is then diced into individual or singulated device components. Each individual MEMS component is subsequently attached to a packaging substrate 23. Packaging substrate 23 is typically ceramic in composition to prevent Radio Frequency (RF) losses that are inherent with substrates such as silicon. MEMS device terminals 26 are then coupled to package leads 27 via wirebonds 24. Then, the MEMS device is hermetically encapsulated with a ceramic cap 28.

One limitation of this technique is that each MEMS device is individually handled and bonded to packaging substrate 23. If the sacrificial protective layer separating the upper and lower control electrodes during fabrication is removed prior to handling, the MEMS device becomes extremely fragile and subject to damage during handling and bonding. If the sacrificial protective layer is not removed prior to handling and bonding, the processing becomes much more complicated due to substrate interaction when the sacrificial protective layer is later removed. In either case, the effective yield of the manufacturing process is adversely impacted. Another limitation of the cap/cavity approach is that the upper surface of packaging substrate 23 has many topographic variations which may prevent the creation of a hermetic seal between it and cap 28.

A limitation common to both the glass paste wafer capping technique and the cap/cavity technique is the requirement for wirebonding the MEMS device to external leads. An intrinsic limitation of wirebonding is the parasitic inductance inherent in the wirebond. This parasitic inductance degrades the RF performance of MEMS devices.

Therefore, a need exists to provide a more reliable, cost effective, and robust MEMS device and method of manufacture that overcomes the deficiencies of the prior techniques.

BRIEF DESCRIPTION OF THE DRAWINGS

FIG. 1 illustrates a MEMS device manufactured in accordance with a prior art technique referred to as a glass paste wafer capping technique;

FIG. 2 illustrates a MEMS device manufactured in accordance with a prior art technique referred to as a cap/cavity technique;

FIG. 3 is a cross-sectional side view of a MEMS device at an initial stage of manufacture;

FIG. 4 is a cross-sectional side view of the MEMS device of FIG. 3 at a later stage of manufacture;

For simplicity and clarity of illustration, elements in the drawings are not necessarily drawn to scale, and the same reference numerals in different figures denote the same elements.

DETAILED DESCRIPTION OF THE DRAWINGS

Figure 5:
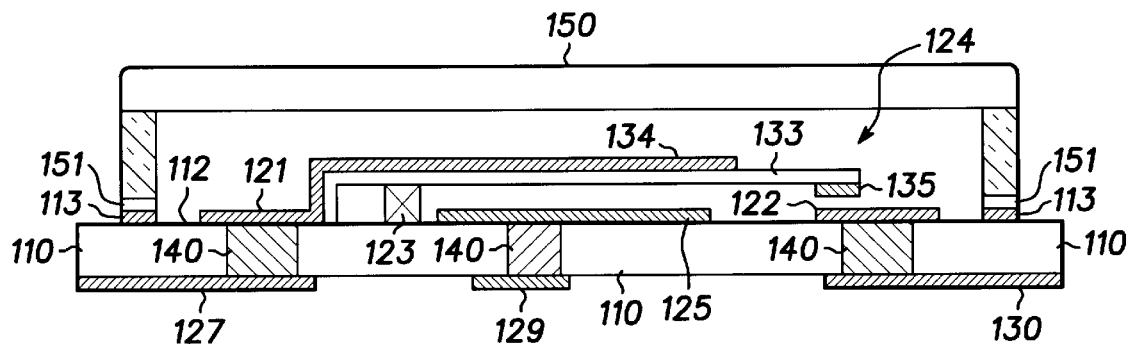
FIG. 5 is a cross-sectional side view of the MEMS device of FIG. 4 at a later stage of manufacture.

FIG. 3 illustrates an initial stage in the manufacture of a MEMS device 100. What is shown in FIG. 3 is a cross-sectional side view of a packaging substrate 110 having surfaces 111 and 112 and a plurality of vias 141 selectively formed therein. Conventional photolithographic methods may be employed to form vias 141. It should be understood the that the techniques for forming vias 141 is not a limitation of the present invention.

Now referring to FIG. 4, MEMS device 100 is shown at a later stage of manufacture. Vias 141 are filled with an electrically conductive material such as, for example, copper, gold, aluminum, alloys of copper, alloys of gold, and the like, to form conductively filled vias 140. It should be noted that a filled via does not need to be completely filled to be considered a filled via. Rather, a filled via can be partially filled as long as electrical contact can be made from surface 111 to surface 112.

A conductive layer is patterned on surface 111 of packaging substrate 110 to form electrical interconnects 127, 129, and 130, which are in electrical contact with corresponding conductively filled vias 140. Suitable materials for electrical interconnects 130 include aluminum, gold, copper, nickel, tin, alloys of aluminum, gold, copper, nickel or tin, cobalt, chromium, suicides of tungsten or tantalum, filled epoxies, filled silicones, or the like. It should be understood that electrical interconnects 130 are an optional feature.

A conductive layer is patterned on surface 112 of packaging substrate 110. This conductive layer forms the basis for several of the MEMS components 124 such as MEMS switches and MEMS sensors. By way of example, the conductive layer may be patterned to form control leads 121, transmission terminals 122, control electrode 125, and travel stops 123. Control leads 121 are electrically coupled to corresponding electrical interconnects 130 by conductively filled vias 140. In this example, control leads 121 conduct the actuation voltage in the case of a MEMS switch, which switch may be formed from the conductive layer on surface 112. Transmission terminals 122 are RF input/output terminals. The thicknesses of each of the traces on surface 112, i.e., control leads 121, transmission terminals 122, control electrode 125, and travel stops 123 may be the same or different depending on the particular application. The thicknesses may be varied by, for example, altering the deposition of the material forming the conductive layer.

Additionally, a substrate trace 113 may be formed from the conductive layer patterned on surface 112. Substrate trace 113 is optional and is used for bonding a protective cap 150 to packaging substrate 110 as described with reference to FIG. 5. Further, substrate trace 113 can be manufactured from either electrically conductive or electrically nonconductive material. Suitable materials for electrical interconnects 113 include aluminum, gold, copper, nickel, tin, alloys of aluminum, gold, copper, nickel or tin, cobalt, FIG. 5 is a cross-sectional side view of MEMS device 100 further along in manufacture. A center hinge 137 is coupled to substrate 110 via an anchor 131. Anchor 131 is typically a conductively filled via. Center hinge 137 is electrically connected to a control electrode 132. Control electrode 132 is electrically isolated from control electrode 125, but electrically coupled to at least one of vias 140. By way of example, control electrode 132 is comprised of an electrically nonconductive material, i.e., a dielectric material 133 and an electrically conductive material 134. A suitable material for dielectric layer 133 is silicon oxide nitride. Preferably, layer 134 is comprised of a metal having minimum stiffness and a low thermal expansion coefficient such as, for example, copper, gold, or the like. The geometry of control electrode 132 may vary to optimize charge distribution. By way of example, center hinge 137 and control electrode 132 are formed from the same dielectric and metal layers. The particular materials for layers 133 and 134 are not a limitation of the present invention.

Control electrodes 125 and 132 form a cantilever structure, wherein control electrode 125 is referred to as a lower control electrode and control electrode 132 is referred to as an upper control electrode.

A shorting bar 135 is connected to control electrode 132 for shorting control leads 121 to transmission terminal 122. Thus, shorting bar 135 is positioned over control electrode 125 and transmission terminal 122. Because there is metal to metal contact between shorting bar 135 and transmission terminal 122, it is preferred that shorting bar 135 and transmission terminal 122 be made of different metals. The different metals should each possess a high melting point to reduce stiction and each should be resistant to oxidation to promote reliability.

A protective cap 150 having a cap bonding layer 151 at the bonding perimeter is placed over MEMS component 120 such that it mates with substrate trace 113. Preferably, the composition of substrate trace 113 and cap bonding layer 151 are chosen to achieve alloy bonding therebetween at a temperature less than that of other metals or components of MEMS device 100. In accordance with the present invention, the alloy bonding can be achieved at temperatures ranging from approximately 200° C. to 300° C. and more preferably at temperatures ranging from approximately 200° C. to 250° C. It should be understood that if a hermetic seal is not desired, cap bonding layer 151 can be comprised of filled epoxies or filled silicones.

Figure 6:
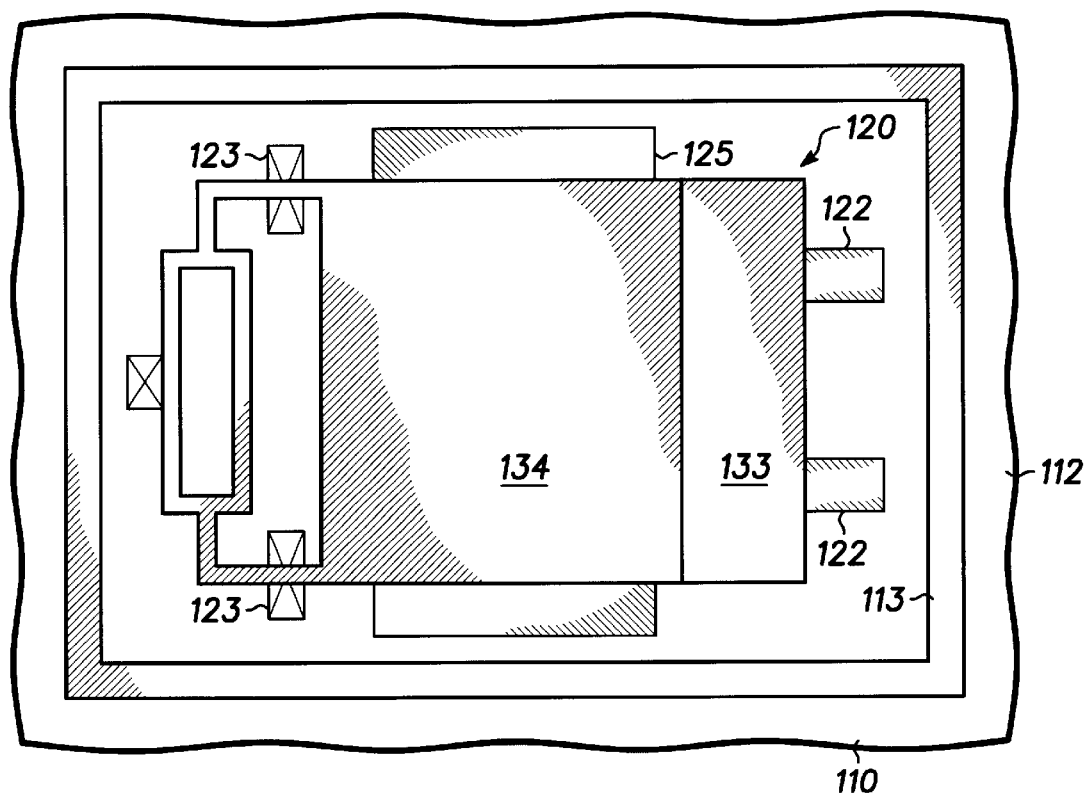
FIG. 6 is a top view of the MEMS device of FIGS. 3–5.

Now referring to FIG. 6, what is shown is a top view of MEMS device 100 in accordance with an embodiment of the present invention prior to sealing with protective cap 150. FIG. 6 further illustrates substrate trace 113 having a rectangular geometry. It should be understood that the geometry of substrate trace 113 is such that it will coincide with cap bonding layer 151. Other suitable geometries for trace 113 and protective cap 150 which can perform substantially the same sealing or protective function include square, circular, pentagonal, and the like.

It should be further understood that trace 113 also forms a planar surface, i.e., a surface without topological deviation, which enhances the formation of a hermetic seal with protective cap 150 is attached.

Packaging substrate 110 which has a plurality of hermetically sealed and packaged MEMS devices 100 is separated into individual devices for test and shipment.

By now it should be appreciated that a MEMS device having a monolithic MEMS component integral with a substrate and a method for manufacturing the MEMS device that are cost efficient and easily integrable into a manufacturing process have been provided. The assembly and packaging for MEMS devices in accordance with the present invention offers several advantages not available with prior art techniques. For example, the MEMS device is fabricated directly from the packaging substrate rather than as a separate component which has to be mounted to a packaging substrate. Incorporating vias and metal interconnects eliminates the need for wirebonds, thereby reducing the problems associated with parasitic inductances in RF applications. Moreover, the MEMS device of the present invention has a planar surface, which permits hermetically sealing the MEMS components 124 within a cavity. The elimination of wirebonds provides for the manufacture of a smaller MEMS device compared to MEMS devices having wirebonds. In addition, the present invention allows bonding the protective cap at temperatures lower than other processing temperatures, which reduces the probability of temperature damage to the MEMS device.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For example, other embodiments could be fabricated to include one or more passive devices, i.e., capacitors, inductors, resistors, within packaging substrate 110 or between packaging substrate 110 and MEMS component 120. Such embodiments would include a more complicated network of vias to interconnect the passive components with each other and with a MEMS component.

What is claimed is:

1. A Micro-Electromechanical System (MEMS) device, comprising:
   a substrate having first and second major surfaces;
   a plurality of conductively filled vias located within a portion of the substrate;
   a first conductive layer over the first major surface of the substrate, a first portion of the first conductive layer electrically connected to a first of the plurality of conductively filled vias; and
   a monolithic MEMS component integral with the substrate having a control electrode formed on the substrate and extending from the substrate and overlying a second via of the plurality of conductively filled vias.

2. The MEMS device of claim 1, wherein the first conductive layer further comprises a second portion electrically isolated from the first portion.

3. The MEMS device of claim 2, wherein the first conductive layer further comprises a third portion electrically isolated from the first and second portions.

4. The MEMS device of claim 3, wherein the third portion is electrically connected to the second via of the plurality of conductively filled vias.

5. The MEMS device of claim 2, further including a protective cap coupled to the second portion.

6. The MEMS device of claim 5, wherein the protective cap comprises a base structure having a periphery, wherein walls extend from the periphery.

7. The MEMS device of claim 6, wherein a portion of the walls includes a protective cap bonding layer.

8. The MEMS device of claim 7, wherein a material of the protective cap bonding layer and a material of the second portion are the same.

9. The MEMS device of claim 7, wherein a material of the protective cap bonding layer is selected from the group of material consisting of aluminum, gold, copper, nickel, tin, an alloy of aluminum, an alloy of gold, an alloy of copper, an alloy of nickel, an alloy of tin, cobalt, chromium, a silicide of tungsten, a silicide of tantalum, filled epoxies, and filled silicones.

10. The MEMS device of claim 1, wherein the monolithic MEMS component is a switch having a shorting bar.

11. The MEMS device of claim 1, further including a second conductive layer over the second major surface, wherein a first portion of the second conductive layer is electrically connected to at least one of the conductively filled vias.

12. The MEMS device of claim 1, wherein the monolithic MEMS component is a sensor.

13. The MEMS device of claim 1, further including a travel stop on the first major surface.

14. A method for manufacturing a Micro-Electromechanical Systems (MEMS) device, comprising:

providing a substrate having first and second major surfaces;

fabricating a plurality of conductively filled vias extending from the first major surface to the second major surface;

fabricating a MEMS component on the first major surface, wherein the MEMS component comprises a control electrode, a control lead, and a transmission terminal formed on the first major surface; and coupling a protective cap to the substrate.

15. The method of claim 14, further including forming a substrate trace on the first major surface.

16. The method of claim 15, further including bonding the protective cap to the substrate trace.

17. The method of claim 16, wherein bonding the protective cap to the substrate trace includes forming a hermetic seal.

18. The method of claim 14, wherein the protective cap is made from an electrically conductive material.

19. The method of claim 14, further including forming a travel stop on the first major surface.

20. The method of claim 14, further including forming an electrical interconnect on the second major surface, the electrical interconnect contacting one of the conductively filled vias.

* * * * *